United States Patent
Ikegami et al.

(10) Patent No.: US 11,688,587 B2
(45) Date of Patent: Jun. 27, 2023

(54) SUBSTRATE SUPPORT ASSEMBLY, PLASMA PROCESSING APPARATUS, AND PLASMA PROCESSING METHOD

(71) Applicant: TOKYO ELECTRON LIMITED, Tokyo (JP)

(72) Inventors: Masashi Ikegami, Miyagi (JP); Yasuharu Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 798 days.

(21) Appl. No.: 16/564,791

(22) Filed: Sep. 9, 2019

(65) Prior Publication Data
US 2020/0118787 A1 Apr. 16, 2020

(30) Foreign Application Priority Data
Oct. 10, 2018 (JP) .............................. JP2018-191614

(51) Int. Cl.
*H01L 21/683* (2006.01)
*H01J 37/32* (2006.01)

(52) U.S. Cl.
CPC .... *H01J 37/32642* (2013.01); *H01L 21/6831* (2013.01)

(58) Field of Classification Search
CPC .......... H01J 37/32642; H01J 37/32715; H01L 21/68721; H01L 21/6831; H01L 21/68785
See application file for complete search history.

(56) References Cited

U.S. PATENT DOCUMENTS

| | | | | |
|---|---|---|---|---|
| 5,747,672 | A * | 5/1998 | Parent | G10K 11/004 73/61.79 |
| 6,363,882 | B1 * | 4/2002 | Hao | H01J 37/32623 118/723 E |
| 2003/0010452 | A1 * | 1/2003 | Park | C23C 16/45565 156/345.33 |
| 2005/0133164 | A1 * | 6/2005 | Fischer | H01L 21/68735 156/345.48 |
| 2007/0111339 | A1 * | 5/2007 | Wege | H01J 37/32623 438/10 |

(Continued)

FOREIGN PATENT DOCUMENTS

| | | |
|---|---|---|
| JP | 2012-125140 A | 6/2012 |
| JP | 2012-222235 A | 11/2012 |

(Continued)

*Primary Examiner* — Aiden Lee
(74) *Attorney, Agent, or Firm* — Weihrouch IP

(57) ABSTRACT

A substrate support assembly includes a supporting table and one or more piezoelectric elements disposed between the supporting table and a focus ring. The supporting table has an upper surface, and the upper surface includes a first region on which a substrate is mounted and a second region on which the focus ring is disposed, the second region extending in a circumferential direction at an outer side of the first region. The one or more piezoelectric elements are disposed between the focus ring and the second region to be in direct or indirect contact with the focus ring and the second region. Changes in thicknesses of the one or more piezoelectric elements cause a change in a vertical position of the focus, and the thicknesses of the one or more piezoelectric elements are adjustable to suppress a generation of a gap between the focus ring and the second region.

28 Claims, 10 Drawing Sheets

(56) References Cited

U.S. PATENT DOCUMENTS

| | | | | |
|---|---|---|---|---|
| 2011/0300714 A1* | 12/2011 | Stevenson | ........... | H01L 21/6831 |
| | | | | 156/345.43 |
| 2013/0112334 A1* | 5/2013 | Tsuno | ............... | H01L 21/67109 |
| | | | | 156/64 |
| 2013/0264309 A1* | 10/2013 | Kenworthy | ............. | H01J 37/32 |
| | | | | 156/345.33 |
| 2013/0288402 A1* | 10/2013 | Morita | .................... | C23C 14/12 |
| | | | | 118/712 |
| 2016/0189994 A1* | 6/2016 | Sasaki | .................... | H02N 13/00 |
| | | | | 361/234 |

FOREIGN PATENT DOCUMENTS

| JP | 2016-509826 A | 3/2016 |
|---|---|---|
| JP | 2016-146472 A | 8/2016 |

\* cited by examiner

SUBSTRATE SUPPORT ASSEMBLY, PLASMA PROCESSING APPARATUS, AND PLASMA PROCESSING METHOD

CROSS-REFERENCE TO RELATED APPLICATIONS

This application claims priority to Japanese Patent Application No. 2018-191614, filed on Oct. 10, 2018, the entire contents of which are incorporated herein by reference.

TECHNICAL FIELD

The present disclosure relates to a substrate support assembly, a plasma processing apparatus, and a plasma processing method.

BACKGROUND

A plasma processing apparatus is used for processing a substrate. The plasma processing apparatus includes a chamber and a supporting table. The supporting table is provided in the chamber. The supporting table supports the substrate mounted thereon. A focus ring is disposed to surround an outer periphery of the substrate. In the plasma processing apparatus, a gas is supplied into the chamber and a high frequency power is supplied to the supporting table. As a result, plasma of the gas is generated.

A thickness of the focus ring decreases as the substrate process progresses over time. When the thickness of the focus ring decreases, a position of a lower end of a sheath above the focus ring becomes lower than that above the substrate. The sheath is inclined above a boundary between an edge of the substrate and the focus ring. Accordingly, a traveling direction of ions supplied to the edge of the substrate is tilted with respect to a vertical direction. Therefore, there is a demand for a technique for correcting the traveling direction of the ions supplied to the edge of the substrate to the vertical direction.

The technique for correcting the traveling direction of the ions supplied to the edge of the substrate to the vertical direction is disclosed in Japanese Patent Application Publication No. 2016-146472. In the technique disclosed in Japanese Patent Application Publication No. 2016-146472, when the thickness of the focus ring decreases, the focus ring is moved upward.

SUMMARY

In view of the above, it is required to adjust the vertical position of the focus ring to suppress an impedance change between the supporting table and the focus ring.

In accordance with an embodiment of the present disclosure, there is provided a substrate support assembly used in a plasma processing apparatus, the substrate support assembly including: a supporting table including a lower electrode and an electrostatic chuck disposed on the lower electrode, and one or more piezoelectric elements disposed between the supporting table and a focus ring. The supporting table has an upper surface, and the upper surface includes a first region on which a substrate is mounted and a second region on which the focus ring is disposed, the second region extending in a circumferential direction at an outer side of the first region. The one or more piezoelectric elements are disposed between the focus ring and the second region to be in direct or indirect contact with the focus ring and the second region. Changes in thicknesses of the one or more piezoelectric elements cause a change in a vertical position of the focus ring, and the thicknesses of the one or more piezoelectric elements are adjustable to suppress a generation of a gap (space) between the focus ring and the second region.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
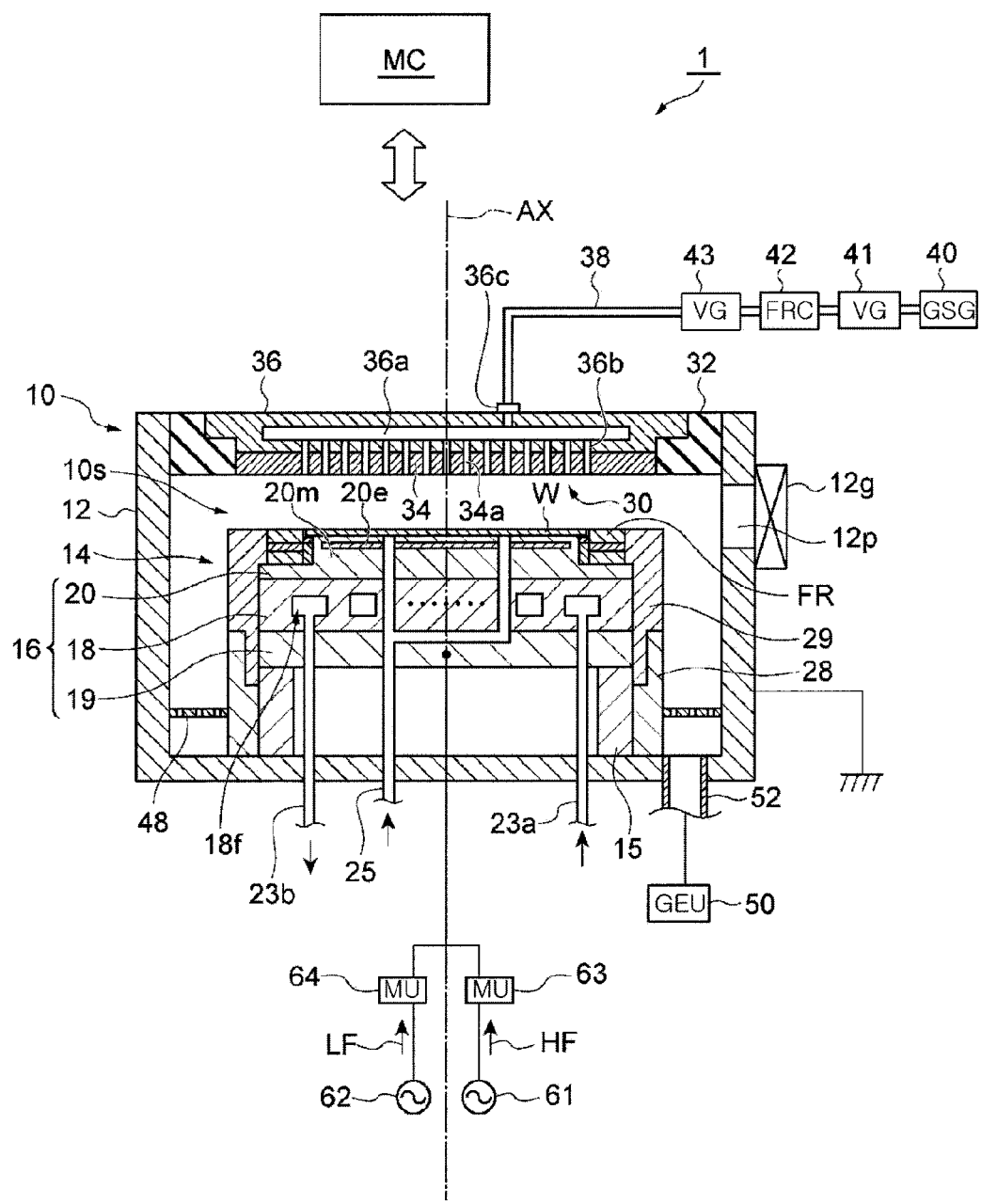
FIG. 1 schematically shows a plasma processing apparatus according to an exemplary embodiment.

Hereinafter, various exemplary embodiments will be described.

In an exemplary embodiment, there is provided a substrate support assembly. The substrate support assembly includes a supporting table and one or more piezoelectric elements. The supporting table includes a lower electrode and an electrostatic chuck. The electrostatic chuck is disposed on the lower electrode. The one or more piezoelectric elements are disposed between the supporting table and a focus ring. The supporting table has an upper surface. The upper surface of the supporting table includes a first region and a second region. A substrate is mounted on the first region. The second region extends in a circumferential direction at an outer side of the first region. The focus ring is disposed on the second region. The one or more piezoelectric elements are disposed between the focus ring and the second region to be in direct or indirect contact with the focus ring and the second region. Changes in thicknesses of the one or more piezoelectric elements cause a change in a vertical position of the focus ring. The thicknesses of the one or more piezoelectric elements are adjustable to suppress a generation of a gap between the focus ring and the second region.

With such configuration, even if the thicknesses of the one or more piezoelectric elements are adjusted to change the vertical position of the focus ring, the generation of the gap between the focus ring and the second region is suppressed. Therefore, it becomes possible to adjust the vertical position of the focus ring to suppress the impedance change between the supporting table and the focus ring.

In the exemplary embodiment, each of the one or more piezoelectric elements may be made of a dielectric elastomer.

In the exemplary embodiment, each of the one or more piezoelectric elements may have multiple first electrode layers and multiple second electrode layers. The first electrode layers may be arranged along a vertical direction and electrically connected to one another. The second electrode layers may be electrically connected to one another and alternately arranged with the first electrode layers in the vertical direction. With such configuration, the thickness of each of the one or more piezoelectric elements can be considerably changed by a low voltage application.

In the exemplary embodiment, each of the one or more piezoelectric elements may be covered with a corrosion-resistant resin. The resin may be a dielectric elastomer forming each of the one or more piezoelectric elements.

In the exemplary embodiment, the substrate support assembly may further include a supporting unit. The supporting unit may include the one or more piezoelectric elements and may be configured to support the focus ring on the second region. The supporting unit fills the gap between the second region and the focus ring, and the thicknesses of the one or more piezoelectric elements are adjustable to maintain a state in which the gap between the second region and the focus ring is filled with the supporting unit.

In the exemplary embodiment, the supporting unit may further include an additional electrostatic chuck configured to hold the focus ring. The additional electrostatic chuck may be disposed between the focus ring and the one or more piezoelectric elements.

In the exemplary embodiment, the one or more piezoelectric elements may include a plurality of piezoelectric elements separated from one another.

In the exemplary embodiment, the focus ring may include a first ring member and a second ring member. The first ring member may be disposed at an inner side of the second ring member above the second region. The plurality of piezoelectric elements may include one or more first piezoelectric elements disposed between the first ring member and the second region and one or more second piezoelectric elements disposed between the second ring member and the second region.

In the exemplary embodiment, the plurality of piezoelectric elements may be coaxially arranged.

In the exemplary embodiment, the plurality of piezoelectric elements may be arranged along the circumferential direction.

In the exemplary embodiment, the plurality of piezoelectric elements may be arranged along the circumferential direction and a radial direction.

In the exemplary embodiment, voltages may be individually applied to the plurality of piezoelectric elements.

In the exemplary embodiment, voltages may be applied to multiple groups, each group including one or more piezoelectric elements among the plurality of piezoelectric elements.

In the exemplary embodiment, a voltage may be applied collectively to the plurality of piezoelectric elements.

In another exemplary embodiment, there is provided a plasma processing apparatus. The plasma processing apparatus may include a chamber and the substrate support assembly described above. The substrate support assembly is disposed in the chamber.

In still another exemplary embodiment, there is provided a plasma processing method using the plasma processing apparatus described above. The plasma processing method may include adjusting the thicknesses of the one or more piezoelectric elements to adjust a vertical position of an upper surface of the focus ring above the second region; and generating plasma in the chamber in a state where the substrate is mounted on the first region of the substrate support assembly.

Hereinafter, various exemplary embodiments will be described in detail with reference to the accompanying drawings. Like reference numerals will be given to like or corresponding parts throughout the drawings.

FIG. 1 schematically shows a plasma processing apparatus according to an exemplary embodiment. A plasma processing apparatus 1 shown in FIG. 1 is a capacitively coupled plasma processing apparatus. The plasma processing apparatus 1 includes a chamber 10. The chamber 10 has an inner space 10s. In the exemplary embodiment, the chamber 10 includes a chamber main body 12. The chamber main body 12 has a substantially cylindrical shape. The inner space 10s is provided in the chamber main body 12. The chamber main body 12 is made of, e.g., aluminum. The chamber main body 12 is electrically grounded. A plasma resistant film is formed on an inner wall surface of the chamber main body 12, i.e., on a wall surface that defines the inner space 10s. The plasma resistant film may be a film formed by anodic oxidation treatment or a ceramic film made of, e.g., yttrium oxide.

An opening 12p is formed at a sidewall of the chamber main body 12. A substrate W is transferred between the inner space 10s and the outside of the chamber 10 through the opening 12p. The opening 12p can be opened and closed by a gate valve 12g. The gate valve 12g extends along the sidewall of the chamber main body 12.

The plasma processing apparatus 1 further includes a substrate support assembly 14 according to the exemplary embodiment. The substrate support assembly 14 is provided in the chamber 10. The substrate support assembly 14 includes a supporting table 16. The supporting table 16 is configured to support the substrate W mounted thereon. The substrate W has a substantially disc shape. The supporting table 16 is supported by a supporting part 15. The supporting part 15 extends upward from a bottom portion of the chamber main body 12. The supporting part 15 has a substantially cylindrical shape. The supporting part 15 is made of an insulating material such as quartz.

The supporting table 16 includes a lower electrode 18 and an electrostatic chuck 20. The supporting table 16 may further include an electrode plate 19. The electrode plate 19 is made of a conductive material such as aluminum, and has a substantially disc shape. The lower electrode 18 is disposed on the electrode plate 19. The lower electrode 18 is made of a conductive material such as aluminum, and has a substantially disc shape. The lower electrode 18 is electrically connected to the electrode plate 19. The supporting table 15 is an example of a support.

A flow path 18f is provided in the lower electrode 18. The flow path 18f is a channel for a heat exchange medium. As an example of the heat exchange medium, a liquid coolant or a coolant (e.g., Freon) for cooling the lower electrode 18 by vaporization thereof is used. A circulation device (e.g., a chiller unit) for the heat exchange medium is connected to the flow path 18f. The circulation device is provided outside the chamber main body 12. The heat exchange medium is supplied to the flow path 18f through a line 23a. The heat exchange medium supplied to the flow path 18f is returned to the circulation device through a line 23b.

The electrostatic chuck 20 is provided on the lower electrode 18. When the substrate W is processed in the inner space 10s, the substrate W is mounted on and held by the electrostatic chuck 20. The electrostatic chuck 20 includes a main body 20m and an electrode 20e. The main body 20m is made of a dielectric material such as aluminum oxide or aluminum nitride, and has a substantially disc shape. The electrode 20e is a conductive film and is provided in the main body 20m. A DC power supply electrically connected to the electrodes 20e through a switch. When a DC voltage is applied from the DC power supply to the electrode 20e, an electrostatic attractive force is generated between the substrate W and the electrostatic chuck 20. Due to the electrostatic attractive force thus generated, the substrate W is attracted to and held by the electrostatic chuck 20.

The plasma processing apparatus 1 may further include a gas supply line 25. A heat transfer gas, e.g., He gas, is supplied through the gas supply line 25 from a gas supply mechanism to a gap between an upper surface of the electrostatic chuck 20 and a backside (bottom surface) of the substrate W.

The plasma processing apparatus 1 may further include a tubular member 28 and an insulating member 29. The tubular member 28 extends upward from the bottom portion of the chamber main body 12. The tubular member 28 extends along an outer periphery of the supporting part 15. The tubular member 28 is made of a conductive material and has a substantially cylindrical shape. The tubular member 28 is electrically grounded. The insulating member 29 is disposed on the tubular member 28. The insulating member 29 is made of an insulating material. The insulating member 29 is made of ceramic, e.g., quartz. The insulating member 29 has a substantially cylindrical shape. The insulating member 29 extends along outer peripheries of the electrode plate 19, the lower electrode 18, and the electrostatic chuck 20.

The plasma processing apparatus 1 further includes an upper electrode 30. The upper electrode 30 is disposed above the supporting table 16. The upper electrode 30 blocks an upper opening of the chamber main body 12 in cooperation with a member 32. The member 32 has an insulating property. The upper electrode 30 is held at an upper portion of the chamber main body 12 through the member 32.

The upper electrode 30 includes a ceiling plate 34 and a holder 36. A bottom surface of the ceiling plate 34 defines the inner space 10s. The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may have a structure in which a plasma resistant film is formed on a surface of an aluminum base material. The plasma resistant film may be a film formed by anodic oxidation treatment or a ceramic film made of yttrium oxide.

The holder 36 detachably holds the ceiling plate 34. The holder 36 may be made of a conductive material such as aluminum. A gas diffusion space 36a is formed in the holder 36. A plurality of gas holes 36b extends downward from the gas diffusion space 36a. The gas holes 36b communicate with the gas injection holes 34a, respectively. A gas inlet port 36c is formed at the holder 36. The gas inlet port 36c is connected to the gas diffusion space 36a. A gas supply line 38 is connected to the gas inlet port 36c.

The gas supply line 38 is connected to a gas source group (GSG) 40 through a valve group (VG) 41, a flow rate controller group (FRC) 42, and a valve group (VG) 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (e.g., opening/closing valves). The flow rate controller group 42 includes a plurality of flow rate controllers. Each of the flow rate controllers of the flow rate controller group 42 is a mass flow controller or a pressure control type flow controller. The gas sources of the gas source group 40 are connected to the gas supply line 38 through the valves of the valve group 41 and the valve group 43, and the flow rate controllers of the flow rate controller group 42, respectively. The plasma processing apparatus 1 is configured to supply gases from one or more gas sources selected among the plurality of gas sources of the gas source group 40 to the inner space 10s at individually controlled flow rates.

A baffle member 48 is disposed between the tubular member 28 and the sidewall of the chamber main body 12. The baffle member 48 is, e.g., an annular plate. The baffle member 48 may be formed by coating ceramic such as yttrium oxide on an aluminum base material, for example. A plurality of through-holes is formed in the baffle member 48. Below the baffle member 48, gas exhaust line 52 connected to the bottom portion of the chamber main body 12. A gas exhaust unit (GEU) 50 is connected to the gas exhaust line 52. The gas exhaust unit 50 includes a pressure controller such as an automatic pressure control valve, and a vacuum pump such as a turbo molecular pump. The gas exhaust unit 50 is configured to decrease pressure in the inner space 10s.

In the exemplary embodiment, the plasma processing apparatus 1 may further include a high frequency power supply 61. The high frequency power supply 61 generates a high frequency power HF for plasma generation. The high frequency power HF has a frequency within a range of 27 MHz to 100 MHz, e.g., 40 MHz or 60 MHz. The high frequency power supply 61 is connected to the lower electrode 18 through a matching unit (MU) 63 and the electrode plate 19 to supply the high frequency power HF to the lower electrode 18. The matching unit 63 has a matching circuit for matching an output impedance of the high frequency power supply 61 and an impedance of a load side (the lower electrode 18 side). The high frequency power supply 61 may not be electrically connected to the lower electrode 18, and may be connected to the upper electrode 30 through the matching unit 63.

The plasma processing apparatus 1 may further include a high frequency power supply 62. The high frequency power supply 62 generates a bias high frequency power, i.e., a high frequency power LF, for attracting ions to the substrate W. The frequency of the high frequency power LF is lower than the frequency of the high frequency power HF. The frequency of the high frequency power LF is within a range of 400 kHz to 13.56 MHz, e.g., 400 kHz. The high frequency power supply 62 is connected to the lower electrode 18 through a matching unit (MU) 64 and the electrode plate 19 to supply the high frequency power LF to the lower electrode 18. The matching unit 64 has a matching circuit for matching an output impedance of the high frequency power supply 62 and the impedance of the load side (the lower electrode 18 side).

When the plasma processing is performed by using the plasma processing apparatus 1, gas is supplied to the inner space 10s. Then, one or both of the high frequency power HF and the high frequency power LF is supplied to excite the gas in the inner space 10s. Accordingly, plasma is generated in the inner space 10s. The substrate W is processed by chemical species such as ions and/or radicals from the generated plasma.

The plasma processing apparatus 1 further includes a control unit MC. The control unit MC is a computer including a processor, a storage device, an input device, a display device, and the like, and controls the respective components of the plasma processing apparatus 1. Specifically, the control unit MC executes a control program stored in the storage device, and controls the respective components of the plasma processing apparatus 1 based on a recipe data stored in the storage device. A process specified by the recipe data is executed in the plasma processing apparatus 1 under the control of the control unit MC. A plasma processing method according to an exemplary embodiment to be described later can be performed by the plasma processing apparatus 1 by controlling the respective components of the plasma processing apparatus 1 under the control of the control unit MC.

Figure 2:
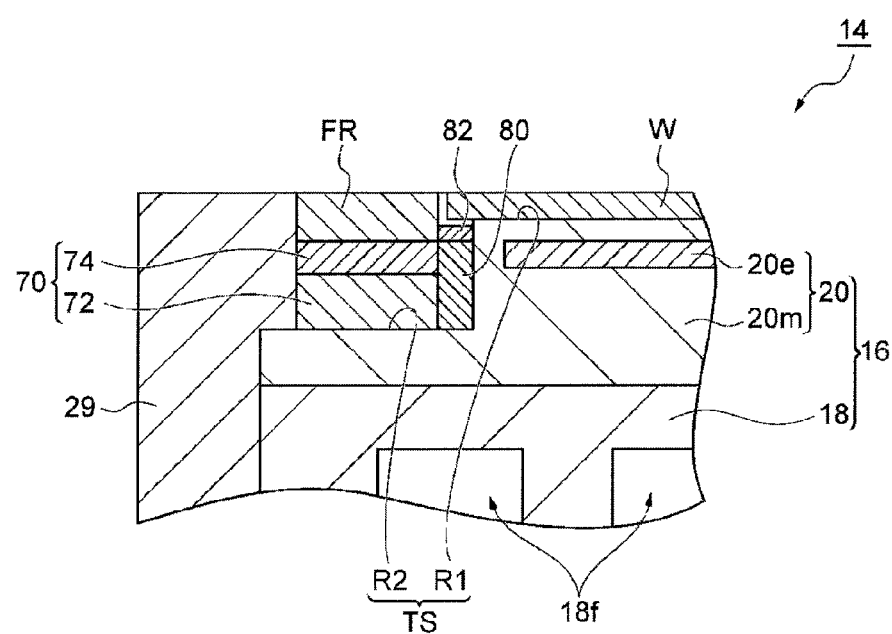
FIG. 2 is a partially enlarged cross-sectional view of a substrate support assembly according to the exemplary embodiment.
Figure 3:
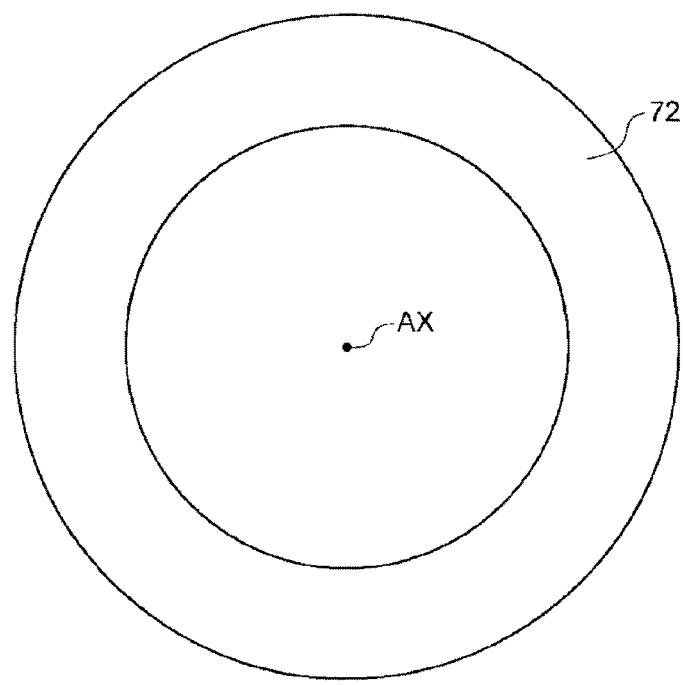
FIG. 3 is a plan view of a piezoelectric element of the substrate support assembly in accordance with the exemplary embodiment.
Figure 4:
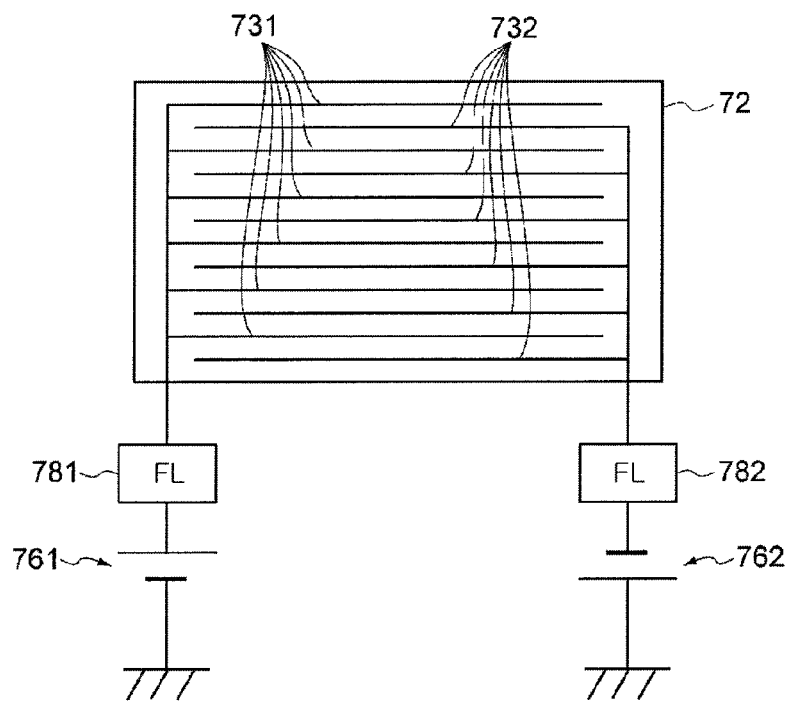
FIG. 4 schematically shows a longitudinal cross-sectional structure of the piezoelectric element of the substrate support assembly according to the exemplary embodiment.

Hereinafter, the substrate support assembly 14 will be further described with reference to FIGS. 2 to 4 in addition to FIG. 1. FIG. 2 is a partially enlarged cross-sectional view of the substrate support assembly according to the exemplary embodiment. FIG. 3 is a plan view of a piezoelectric element of the substrate support assembly according to the exemplary embodiment. FIG. 4 schematically shows a longitudinal cross-sectional structure of the piezoelectric element of the substrate support assembly according to the exemplary embodiment.

As shown in FIGS. 1 and 2, the substrate support assembly 14 is configured to support the focus ring FR. The focus ring FR is disposed to surround an edge of the substrate W. The focus ring FR is made of, e.g., silicon. As shown in FIG. 2, the supporting table 16 of the substrate support assembly 14 has a top surface TS. In the exemplary embodiment, the top surface TS is the upper surface of the electrostatic chuck 20. The top surface TS includes a first region R1 and a second region R2. The substrate is mounted on the first region R1. The first region R1 has a substantially circular planar shape. A diameter of the first region R1 is slightly smaller than a diameter of the substrate W. An axis AX extending in the vertical direction while passing through the center of the first region R1 may substantially coincide with the central axis of the chamber 10.

The second region R2 extends in the circumferential direction at an outer periphery of the first region R1. The focus ring FR is disposed above the second region R2. The second region R2 may be a substantially planar or annular surface. The second region R2 extends below the first region R1.

The substrate support assembly 14 includes a piezoelectric element 72. The piezoelectric element 72 is disposed between the focus ring FR and the second region R2. In the exemplary embodiment, the piezoelectric element 72 has an annular shape and extends in a circumferential direction around the axis AX as shown in FIG. 3. A change in a thickness of the piezoelectric element 72 causes a change in a vertical position (vertical shift) of the focus ring FR. The thickness of the piezoelectric element 72 can be adjusted to suppress the generation of a gap between the focus ring FR and the second region R2.

In the exemplary embodiment, the substrate support assembly 14 may further include a supporting unit 70. The supporting unit 70 has the piezoelectric element 72. The supporting unit 70 is configured to support the focus ring FR on the second region R2. The supporting unit 70 fills the gap between the second region R2 and the focus ring FR. The thickness of the piezoelectric element 72 may be adjusted to maintain the state in which the gap between the second region R2 and the focus ring FR is filled with the supporting unit 70.

The piezoelectric element 72 is disposed between the focus ring FR and the second region R2 to be in direct or indirect contact with the focus ring FR and the second region R2. In the exemplary embodiment, the supporting unit 70 further includes a member 74. The member 74 may have an annular shape. The member 74 is disposed on the piezoelectric element 72 and extends in the circumferential direction around the axis AX. The member 74 is an example of a gap plate and may be an electrostatic chuck or a heat transfer sheet.

In the exemplary embodiment, the entire bottom surface of the member 74 is in contact with an upper surface of the piezoelectric element 72. The entire upper surface of the member 74 may be in contact with a bottom surface of the focus ring FR. The entire bottom surface of the focus ring FR may be in contact with the upper surface of the member 74. The entire bottom surface of the piezoelectric element 72 may be in direct or indirect contact with the second region R2. The thickness of the piezoelectric element 72 can be adjusted while maintaining the contact between the piezoelectric element 72 and the member 74 and the contact (direct or indirect contact) between the piezoelectric element 72 and the second region R2. Therefore, the thickness of the piezoelectric element 72 can be adjusted to suppress the generation of the gap between the focus ring FR and the second region R2.

In the exemplary embodiment, the piezoelectric element 72 is made of a dielectric elastomer. The dielectric elastomer may be a fluorine-based dielectric elastomer, an acrylic dielectric elastomer, or a silicone-based dielectric elastomer. The fluorine-based dielectric elastomer may be, e.g., vinylidene fluoride.

As shown in FIG. 4, the piezoelectric element 72 may have a plurality of first electrode layers 731 and a plurality of second electrode layers 732. The first electrode layers 731 are arranged along the vertical direction, and are electrically connected to one another. The second electrode layers 732 are electrically connected to one another, and are alternately arranged with the first electrode layers 731 in the vertical direction. The first electrode layers 731 and the second electrode layers 732 are formed in the piezoelectric element 72 below a surface of the piezoelectric element 72. The surface of the piezoelectric element 72 may be made of a dielectric elastomer forming the piezoelectric element 72.

A DC power supply 761 is electrically connected to the first electrode layers 731 through a filter (FL) 781. A DC power supply 762 is electrically connected to the second electrode layers 732 through a filter (FL) 782. Each of the filter 781 and the filter 782 blocks or attenuates a high frequency. The vertical thickness of the piezoelectric element 72 is adjusted by a DC voltage applied from the DC power supply 761 to the first electrode layers 731 and a DC voltage applied from the DC power supply 762 to the second electrode layers 732. In accordance with the present embodiment, the thickness of the piezoelectric element 72 can be considerably changed by a low voltage application. In addition, the piezoelectric element 72 may have one first electrode layer 731 and one second electrode layer 732.

As shown in FIG. 2, the substrate support assembly 14 further includes a support 80 and a ring member 82. The edge of the substrate W extends radially from a circumferential edge of the first region R1. The support 80 and the ring member 82 are disposed on the second region R2 to be positioned between the second region R2 and a bottom surface of the edge of the substrate W.

The ring member 82 has an annular shape. The ring member 82 extends in the circumferential direction around the axis AX, and is disposed at an inner side of the focus ring FR. The ring member 82 is made of the same material as that of the focus ring FR or a material having substantially the same dielectric constant as that of the focus ring FR.

The support 80 is disposed on the second region R2. The support 80 supports the ring member 82 mounted thereon. The support 80 extends in the circumferential direction around the axis AX, and is disposed at an inner side of the supporting unit 70. Similar to the supporting unit 70, the ring member 82 may be made of a dielectric elastomer and an electrostatic chuck or a heat transfer sheet. As long as an impedance between the upper surface of the edge of the substrate W and the second region R2 is substantially the same as an impedance between the upper surface of the focus ring FR and the second region R2, the number of components forming the support 80 and the materials thereof are not limited.

With the structure of the substrate support assembly described above, even if the thickness of the piezoelectric element 72 is adjusted to change the vertical position of the focus ring FR, the generation of a gap between the focus ring FR and the second region R2 is suppressed. Therefore, the vertical position of the focus ring FR can be adjusted to suppress the impedance change between the supporting table 16 and the focus ring FR. Accordingly, in accordance with the plasma processing apparatus 1, it is possible to suppress the impedance change between the supporting table 16 and the focus ring FR, and also possible to allow ions to be vertically incident on the edge of the substrate W.

Hereinafter, other exemplary embodiments will be described below with reference to FIGS. 5 to 9.

Figure 5:
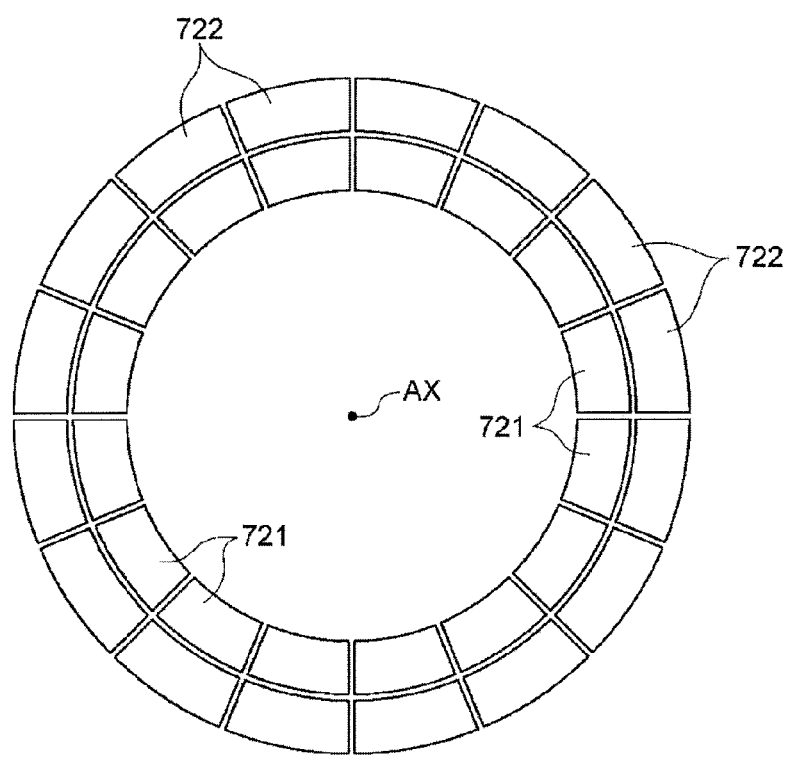
FIG. 5 is a plan view of a plurality of piezoelectric elements of a substrate support assembly according to another exemplary embodiment.

In another exemplary embodiment, the substrate support assembly may include a plurality of piezoelectric elements separated from one another. FIG. 5 is a plan view of a plurality of piezoelectric elements of a substrate support assembly according to another exemplary embodiment. As shown in FIG. 5, the substrate support assembly 14 may include a plurality of piezoelectric elements arranged in a radial direction and in a circumferential direction, instead of the single piezoelectric element 72. The piezoelectric elements shown in FIG. 5 may be made of the same material as that of the piezoelectric element 72 and may have the same cross-sectional structure as that of the piezoelectric element 72. The piezoelectric elements shown in FIG. 5 are separated from one another. The piezoelectric elements shown in FIG. 5 include multiple piezoelectric elements 721 and multiple piezoelectric elements 722. The piezoelectric elements 722 are disposed on the second region R2 and arranged in the circumferential direction around the axis AX. The piezoelectric elements 721 are disposed on the second region R2 and at the inner side of the ring formed by the piezoelectric elements 722, and are arranged in the circumferential direction around the axis AX.

Figure 6:
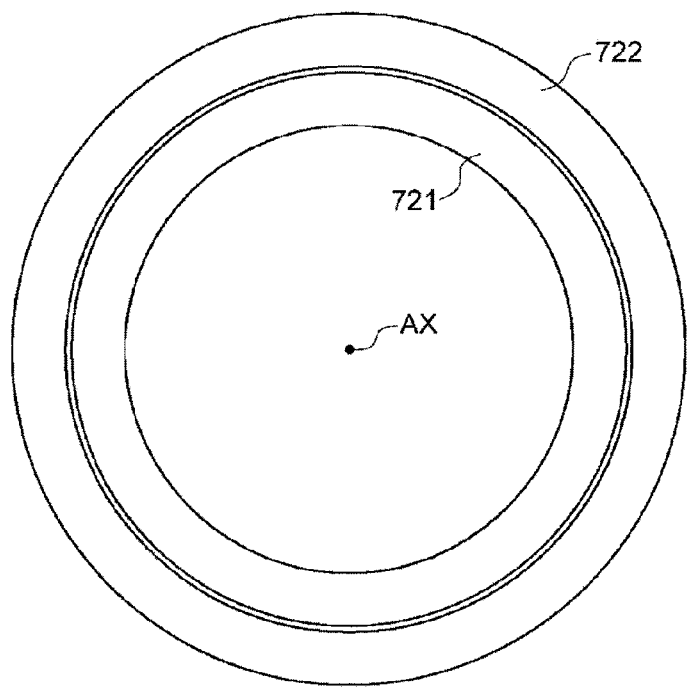
FIG. 6 is a plan view of a plurality of piezoelectric elements of a substrate support assembly according to still another exemplary embodiment.

FIG. 6 is a plan view showing a plurality of piezoelectric elements of a substrate support assembly according to still another exemplary embodiment. As shown in FIG. 6, the substrate support assembly 14 may include a plurality of coaxially arranged piezoelectric elements, instead of the single piezoelectric element 72. The piezoelectric elements shown in FIG. 6 may be made of the same material as that of the piezoelectric element 72 and may have the same cross-sectional structure as that of the piezoelectric element 72. The piezoelectric elements shown in FIG. 6 are separated from one another. The piezoelectric elements shown in FIG. 6 include a piezoelectric element 721 and a piezoelectric element 722. Each of the piezoelectric element 721 and the piezoelectric element 722 has an annular shape and circumferentially extends around the axis AX. The piezoelectric element 721 is disposed at the inner side of the piezoelectric element 722.

Figure 7:
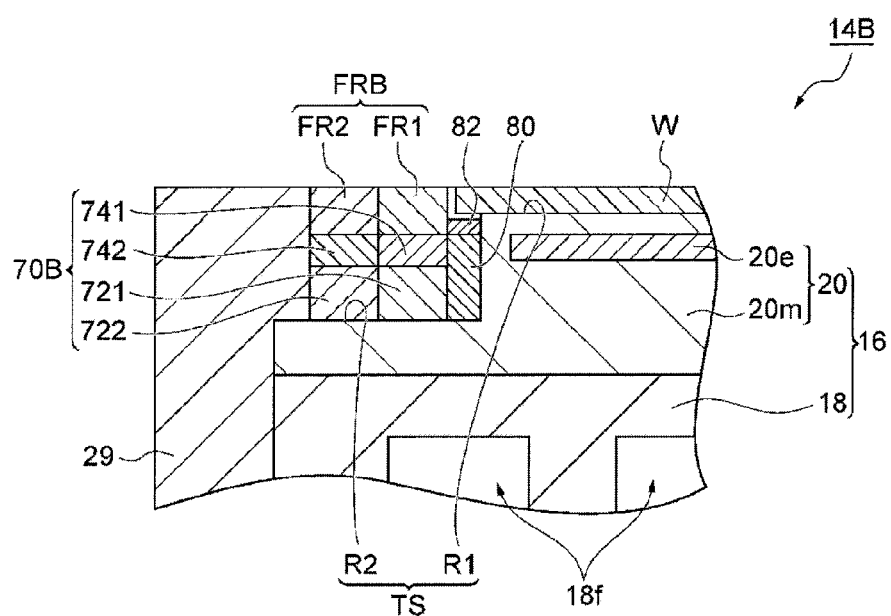
FIG. 7 is a partially enlarged cross-sectional view of the substrate support assembly of FIG. 5 or FIG. 6.

FIG. 7 is a partially enlarged cross-sectional view of the substrate support assembly of FIG. 5 or FIG. 6. A substrate support assembly 14B shown in FIG. 7 may be employed in the plasma processing apparatus 1, instead of the substrate support assembly 14. The substrate support assembly 14B includes a supporting unit 70B. The supporting unit 70B has a plurality of piezoelectric elements, one or more first members 741, and one or more second members 742. The piezoelectric elements of the supporting unit 70B include one or more piezoelectric elements 721. One or more piezoelectric elements 721 of the supporting unit 70B may be the piezoelectric elements 721 shown in FIG. 5 or the piezoelectric element 721 shown in FIG. 6. The piezoelectric elements of the supporting unit 70B further include one or more piezoelectric elements 722. One or more piezoelectric elements 722 of the supporting unit 70B may be the piezoelectric elements 722 shown in FIG. 5 or the piezoelectric element 722 shown in FIG. 6.

One or more first members 741 are disposed on the one or more piezoelectric elements 721. One or more second members 742 are disposed on one or more piezoelectric elements 722. Each of one or more first members 741 and one or more second members 742 may be an electrostatic chuck or a heat transfer sheet.

The supporting unit 70B is configured to support the focus ring FRB. The focus ring FRB includes a first ring member FR1 and a second ring member FR2. Each of the first ring member FR1 and the second ring member FR2 may be made of the same material as that of the focus ring FR. Each of the first ring member FR1 and the second ring member FR2 has an annular shape and circumferentially extends around the axis AX. The first ring member FR1 and the second ring member FR2 are examples of a first ring segment and a second ring segment, respectively. The first ring member FR1 is disposed at an inner side of the second ring member FR2 above the second region R2.

One or more piezoelectric elements 721 are disposed between one or more first ring members FR1 and the second region R2. One or more piezoelectric elements 722 are disposed between one or more second ring members FR2 and the second region R2. In one embodiment, the entire bottom surface of each of one or more first members 741 may be in contact with an upper surface of the piezoelectric element 721 corresponding thereto. The entire upper surfaces of one or more first members 741 may be in contact with a bottom surface of the first ring member FR1. The entire bottom surface of each of one or more piezoelectric elements 721 may be in direct or indirect contact with the second region R2. The entire bottom surface of each of one or more second members 742 may be in contact with an upper surface of the piezoelectric element 722 corresponding thereto. The entire upper surfaces of one or more second members 742 may be in contact with a bottom surface of the second ring member FR2. The entire bottom surface of each of one or more piezoelectric elements 722 may be in direct or indirect contact with the second region R2. Therefore, the thicknesses of one or more piezoelectric elements 721 and the thicknesses of one or more piezoelectric elements 722 can be adjusted to suppress the generation of the gap between the focus ring FR and the second region R2.

Figure 8:
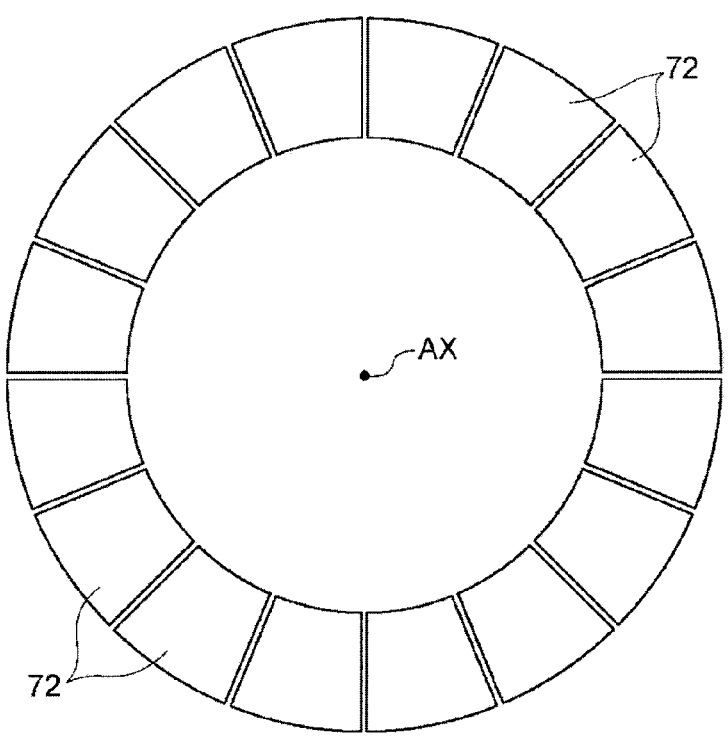
FIG. 8 is a plan view of a plurality of piezoelectric elements of a substrate support assembly according to further still another exemplary embodiment.

FIG. 8 is a plan view of a plurality of piezoelectric elements of a substrate support assembly according to further still another exemplary embodiment. As shown in FIG. 8, the substrate support assembly may include a plurality of piezoelectric elements 72, instead of the single piezoelectric element 72. The piezoelectric elements 72 shown in FIG. 8 are arranged in the circumferential direction around the axis AX. The piezoelectric elements 72 shown in FIG. 8 may be made of the same material as that of the piezoelectric element 72 shown in FIG. 4, and may have the same cross-sectional structure as that of the piezoelectric element 72 shown in FIG. 4. The piezoelectric elements 72 shown in FIG. 8 are separated from one another.

In the substrate support assemblies according to the above-described exemplary embodiments, a voltage may be applied collectively to the piezoelectric elements. In this case, one DC power supply 761 and one DC power supply 762 are used to apply the voltage to the piezoelectric elements.

Alternatively, in the substrate support assemblies according to the above-described exemplary embodiments, voltages may be individually applied to the piezoelectric elements. In this case, the same number of DC power supplies 761 as that of the piezoelectric elements and the same number of DC power supplies 762 as that of the piezoelectric elements are used to individually apply voltages to the piezoelectric elements.

Alternatively, in the substrate support assemblies according to the above-described exemplary embodiments, voltages may be individually applied to multiple groups, each including one or more piezoelectric elements among the plurality of piezoelectric elements. In this case, the same number of DC power supplies 761 as that of the groups and the same number of DC power supplies 762 as that of the groups are used to apply voltages to the multiple groups. Each group may include a number of piezoelectric elements arranged in the circumferential direction among the plurality of piezoelectric elements. Alternatively, each group may include a number of piezoelectric elements arranged in the circumferential direction and in the radial direction among the plurality of piezoelectric elements.

Figure 9:
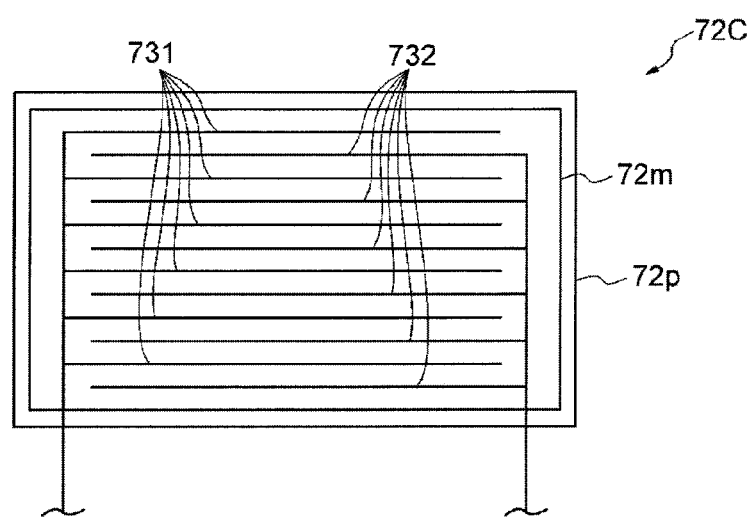
FIG. 9 shows a longitudinal cross-sectional structure of a piezoelectric element of the substrate support assembly according to further still another exemplary embodiment.

FIG. 9 schematically shows a longitudinal cross-sectional structure of a piezoelectric element of a substrate support assembly according to further still another exemplary embodiment. A piezoelectric element 72C shown in FIG. 9 may be employed as each of one or more piezoelectric elements according to the above-described exemplary embodiments. The piezoelectric element 72C has a main body 72m. The main body 72m may be made of a dielectric elastomer. The piezoelectric element 72C may have a plurality of first electrode layers 731 and a plurality of second electrode layers 732. The first electrode layers 731 and the second electrode layers 732 are disposed in the main body 72m. The surface of the main body 72m is covered with a resin 72p that is corrosion-resistant to plasma generated in the chamber 10 or to chemical species from the plasma.

Figure 10:
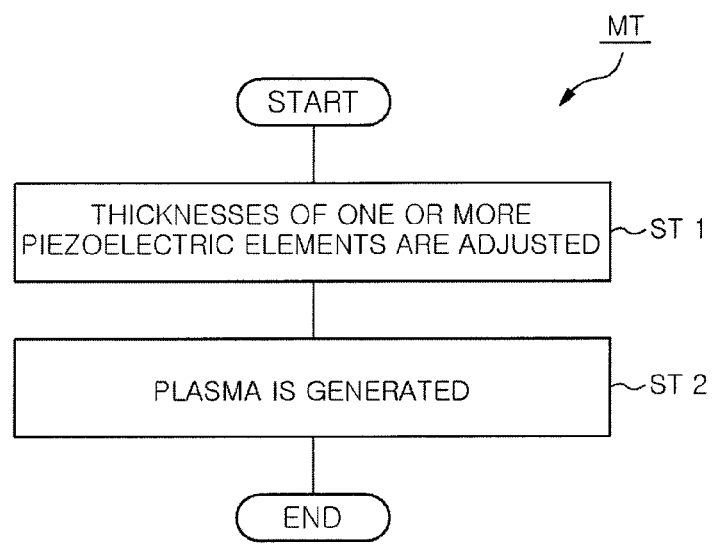
FIG. 10 is a flowchart showing a plasma processing method according to an exemplary embodiment.

Hereinafter, a plasma processing method according to an exemplary embodiment will be described with reference to FIG. 10. FIG. 10 is a flowchart of the plasma processing method according to the exemplary embodiment. In the following description, the case of performing the plasma processing method using the plasma processing apparatus 1 will be described as an example.

In the plasma processing method (hereinafter, referred to as "method MT") shown in FIG. 10, step ST1 is executed first. In step ST1, the thicknesses of one or more piezoelectric elements of the substrate support assembly of the plasma processing apparatus 1 are adjusted by applying voltages to one or more piezoelectric elements. The thicknesses of one or more piezoelectric elements are adjusted to set the vertical position of the upper surface of the focus ring to a reference position determined to set the traveling direction of the ions supplied to the edge of the substrate W to the vertical direction. The vertical position of the upper surface of the focus ring may be determined by a period of time in which the focus ring is exposed to the plasma. The vertical position of the upper surface of the focus ring may be optically measured by a sensor. The vertical position of the upper surface of the focus ring may be determined by the thickness of the focus ring optically measured by the sensor. Alternatively, the vertical position of the upper surface of the focus ring may be determined by the thickness of the focus ring electrically measured by a sensor.

Next, in step ST2, plasma is generated in the chamber 10 in a state where the substrate W is mounted on the first region R1. The substrate W is held by the electrostatic chuck 20. In step ST2, gas is supplied from the gas supply unit into the chamber 10. In step ST2, the high frequency power HF from the high frequency power supply 61 and/or the high frequency power LF from the high frequency power supply 62 are supplied. In the step ST2, the plasma is generated from the gas in the chamber 10. The substrate W is processed by chemical species (e.g., ions and/or radicals) from the plasma thus generated.

While various embodiments have been described above, various omissions, substitutions, and changes may be made without being limited to the above-described embodiments. It is also possible to combine elements in different embodiments to form other embodiments.

The substrate support assemblies according to various exemplary embodiments may be used in any type of plasma processing apparatus other than the plasma processing apparatus 1 described above. For example, the substrate support assemblies according to various exemplary embodiments may be used in other capacitively coupled plasma processing apparatus, an inductively coupled plasma processing apparatus, or a plasma processing apparatus that generates plasma using surface waves such as microwaves.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate support assembly used in a plasma processing apparatus, comprising:
   an electrostatic chuck having a central region and an annular region, the annular region surrounding the central region; and
   at least one piezoelectric device disposed on the annular region of the electrostatic chuck, the at least one piezoelectric device having a variable thickness in response to an applied voltage;
an annular electrostatic chuck disposed on the at least one piezoelectric device; and
a focus ring disposed on the annular electrostatic chuck so as to surround a substrate on the central region of the electrostatic chuck, the focus ring being vertically shifted by a variation in thickness of the at least one piezoelectric device.

2. The substrate support assembly of claim 1, wherein the at least one piezoelectric device comprises a dielectric elastomer.

3. The substrate support assembly of claim 1, wherein the at least one piezoelectric device includes multiple first electrode layers and multiple second electrode layers alternately disposed in a vertical direction,
the first electrode layers are electrically connected to one another, and
the second electrode layers are electrically connected to one another.

4. The substrate support assembly of claim 1, wherein the at least one piezoelectric device is covered with a corrosion-resistant resin.

5. The substrate support assembly of claim 1, wherein the at least one piezoelectric device include a plurality of piezoelectric device separated from one another.

6. The substrate support assembly of claim 5, wherein
the focus ring includes a first ring segment and a second ring segment,
the first ring segment is disposed inside the second ring segment above the annular region, and
the plurality of piezoelectric device include at least one first piezoelectric device disposed between the first ring segment and the annular region and at least one second piezoelectric device disposed between the second ring segment and the annular region.

7. The substrate support assembly of claim 5, wherein the piezoelectric devices are coaxially disposed.

8. The substrate support assembly of claim 5, wherein the piezoelectric devices are circumferentially disposed.

9. The substrate support assembly of claim 5, wherein the piezoelectric devices are coaxially and circumferentially disposed.

10. The substrate support assembly of claim 5, wherein voltages are separately applicable to the piezoelectric devices.

11. The substrate support assembly of claim 5, wherein the piezoelectric devices are categorized into a plurality of groups, and voltages are separately applicable to the groups.

12. The substrate support assembly of claim 5, wherein a voltage is applied collectively to all the piezoelectric devices.

13. A plasma processing apparatus comprising:
a plasma processing chamber;
a substrate support assembly disposed in the plasma processing chamber, and
a DC power source,
wherein the substrate support assembly includes:
an electrostatic chuck having a central region and an annular region, the annular region surrounding the central region;
at least one piezoelectric device disposed on the annular region of the electrostatic chuck, the at least one piezoelectric device having a variable thickness in response to a voltage applied by the DC power source;
an annular electrostatic chuck disposed on the at least one piezoelectric device; and,
a focus ring disposed on the annular electrostatic chuck so as to surround a substrate on the central region of the electrostatic chuck, the focus ring being vertically shifted by a variation in thicknesses of the at least one piezoelectric device.

14. The plasma processing apparatus of claim 13, wherein the at least one piezoelectric device comprises a dielectric elastomer.

15. The plasma processing apparatus of claim 13, wherein the at least one piezoelectric device includes multiple first electrode layers and multiple second electrode layers alternately disposed in a vertical direction,
the first electrode layers are electrically connected to one another, and
the second electrode layers are electrically connected to one another.

16. The plasma apparatus of claim 13, wherein the at least one piezoelectric device is covered with a corrosion-resistant resin.

17. The plasma processing apparatus of claim 13, wherein the at least one piezoelectric device includes a plurality of piezoelectric devices which are separated from one another.

18. The plasma processing apparatus of claim 17, wherein the focus ring includes a first ring segment and a second ring segment,
the first ring segment is disposed inside the second ring segment above the annular region, and
the plurality of piezoelectric devices include at least one first piezoelectric device disposed between the first ring segment and the annular region and at least one second piezoelectric device disposed between the second ring segment and the annular region.

19. The plasma processing apparatus of claim 17, wherein the piezoelectric devices are coaxially disposed.

20. The plasma processing apparatus of claim 17, wherein the piezoelectric devices are circumferentially disposed.

21. The plasma processing apparatus of claim 17, wherein the piezoelectric devices are coaxially and circumferentially disposed.

22. The plasma processing apparatus of claim 17, wherein voltages are separately applicable to the piezoelectric devices.

23. The plasma processing apparatus of claim 17, wherein the piezoelectric devices are categorized into a plurality of groups, and voltages are separately applicable to the groups.

24. The plasma processing apparatus of claim 17, wherein a voltage is applied collectively to all the piezoelectric devices.

25. A method of plasma processing comprising: providing a processing apparatus comprising:
a plasma processing chamber;
a substrate support assembly disposed in the plasma processing chamber, and
a DC power source,
wherein the substrate support assembly includes:
an electrostatic chuck having a central region and an annular region, the annular region surrounding the central region;
at least one piezoelectric device disposed on the annular region of the electrostatic chuck, the at least one piezoelectric device having a variable thickness in response to a voltage applied by the DC power source;
an annular electrostatic chuck disposed on the at least one piezoelectric device; and a focus ring disposed on the annular electrostatic chuck so as to surround a substrate on the central region of the electrostatic chuck, the focus ring being vertically shifted by a variation in thicknesses of the at least one piezoelectric device, the method further comprising:

adjusting the thicknesses of the at least one piezoelectric device to at least one of: (i) shift a vertical position of the focus ring, or (ii) suppress gap formation between the focus ring and the annular region; and generating a plasma in the plasma processing chamber while mounting the substrate on the central region.

26. The method of claim 25, wherein the adjusting the thickness of the at least one piezoelectric device adjusts a position of an upper surface of the focus ring.

27. The method of claim 26, wherein the adjusting the thickness to adjust the position of the upper suface of the focus ring comprises at least one of:
   (i) adjusting the position of the upper surface of the focus ring based on a period of time the focus ring is exposed to plasma;
   (ii) adjusting the position of the upper surface of the focus ring based on a measured position of the upper surface; or
   (iii) adjusting the position of the upper surface of the focus ring based on a measured thickness of the focus ring.

28. The method of claim 27, wherein the thickness of the at least one piezoelectric device is adjusted to suppress gap formation between the focus ring and the annular region.

* * * * *